(12) United States Patent
Kemper et al.

(10) Patent No.: US 7,834,974 B2
(45) Date of Patent: Nov. 16, 2010

(54) LITHOGRAPHIC APPARATUS AND DEVICE MANUFACTURING METHOD

(75) Inventors: Nicolaas Rudolf Kemper, Eindhoven (NL); Sjoerd Nicolaas Lambertus Donders, s'Hertogenbosch (NL); Christiaan Alexander Hoogendam, Veldhoven (NL); Nicolaas Ten Kate, Almkerk (NL); Sergei Shulepov, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 400 days.

(21) Appl. No.: 11/167,552

(22) Filed: Jun. 28, 2005

(65) Prior Publication Data

US 2007/0030464 A1 Feb. 8, 2007

(51) Int. Cl.
G03B 27/52 (2006.01)
G03B 27/42 (2006.01)

(52) U.S. Cl. .......................................... 355/30; 355/53
(58) Field of Classification Search .................. 355/30, 355/53, 55
See application file for complete search history.

(56) References Cited

U.S. PATENT DOCUMENTS

| | | | |
|---|---|---|---|
| 3,573,975 A | 4/1971 | Dhaka et al. ................. | 117/212 |
| 3,648,587 A | 3/1972 | Stevens ......................... | 95/44 |
| 4,346,164 A | 8/1982 | Tabarelli et al. ............. | 430/311 |
| 4,390,273 A | 6/1983 | Loebach et al. ............. | 355/125 |
| 4,396,705 A | 8/1983 | Akeyama et al. ............ | 430/326 |
| 4,480,910 A | 11/1984 | Takanashi et al. ............. | 355/30 |
| 4,509,852 A | 4/1985 | Tabarelli et al. | |
| 5,040,020 A | 8/1991 | Rauschenbach et al. ....... | 355/53 |
| 5,121,256 A | 6/1992 | Corle et al. ................. | 359/664 |
| 5,610,683 A | 3/1997 | Takahashi .................... | 355/53 |
| 5,825,043 A | 10/1998 | Suwa ......................... | 250/548 |
| 5,900,354 A | 5/1999 | Batchelder .................. | 430/395 |
| 6,191,429 B1 | 2/2001 | Suwa | |
| 6,236,634 B1 | 5/2001 | Lee et al. ..................... | 369/112 |
| 6,405,452 B1 | 6/2002 | Twu et al. ...................... | 34/467 |
| 6,600,547 B2 | 7/2003 | Watson et al. ................. | 355/30 |
| 6,603,130 B1 | 8/2003 | Bisschops et al. ........ | 250/492.1 |
| 2002/0020821 A1 | 2/2002 | Van Santen et al. ......... | 250/492 |
| 2002/0163629 A1 | 11/2002 | Switkes et al. ................ | 355/53 |
| 2003/0123040 A1 | 7/2003 | Almogy ........................ | 355/69 |
| 2004/0000627 A1 | 1/2004 | Schuster .................. | 250/201.2 |
| 2004/0031167 A1 | 2/2004 | Stein et al. | |
| 2004/0075895 A1 | 4/2004 | Lin ............................. | 359/380 |
| 2004/0114117 A1 | 6/2004 | Bleeker ....................... | 355/53 |
| 2004/0136494 A1 | 7/2004 | Lof et al. | |

(Continued)

FOREIGN PATENT DOCUMENTS

DE 206 607 2/1984

(Continued)

OTHER PUBLICATIONS

European Search Report issued for European Patent Application No. 06253179.3, dated Nov. 7, 2006.

(Continued)

*Primary Examiner*—Peter B Kim
(74) *Attorney, Agent, or Firm*—Pillsbury Winthrop Shaw Pittman LLP

(57) ABSTRACT

A gas knife configured to dry a surface in an immersion lithographic apparatus is optimized to remove liquid by ensuring that a pressure gradient is built up in the liquid film on the surface being dried.

22 Claims, 5 Drawing Sheets

U.S. PATENT DOCUMENTS

| | | |
|---|---|---|
| 2004/0160582 A1 | 8/2004 | Lof et al. ............... 355/30 |
| 2004/0165159 A1 | 8/2004 | Lof et al. ............... 355/30 |
| 2004/0207824 A1 | 10/2004 | Lof et al. |
| 2004/0211920 A1 | 10/2004 | Derksen et al. ........ 250/492.1 |
| 2004/0212791 A1* | 10/2004 | De Bokx et al. ............ 355/30 |
| 2004/0239954 A1 | 12/2004 | Bischoff ............... 356/635 |
| 2004/0257544 A1 | 12/2004 | Vogel et al. ............... 355/50 |
| 2004/0263809 A1 | 12/2004 | Nakano ............... 355/30 |
| 2005/0007569 A1 | 1/2005 | Streefkerk et al. ............ 355/30 |
| 2005/0018155 A1* | 1/2005 | Cox et al. ............... 355/30 |
| 2005/0024609 A1 | 2/2005 | De Smit et al. ............... 355/18 |
| 2005/0030497 A1 | 2/2005 | Nakamura ............... 355/30 |
| 2005/0046813 A1 | 3/2005 | Streefkerk et al. ............ 355/30 |
| 2005/0046934 A1 | 3/2005 | Ho et al. ............... 359/380 |
| 2005/0052632 A1 | 3/2005 | Miyajima ............... 355/53 |
| 2005/0094116 A1 | 5/2005 | Flagello et al. ............... 355/53 |
| 2005/0094125 A1 | 5/2005 | Arai ............... 355/72 |
| 2005/0122505 A1 | 6/2005 | Miyajima ............... 355/72 |
| 2005/0132914 A1 | 6/2005 | Mulkens et al. ........ 101/463.1 |
| 2005/0134817 A1 | 6/2005 | Nakamura ............... 355/53 |
| 2005/0140948 A1 | 6/2005 | Tokita ............... 355/30 |
| 2005/0146693 A1 | 7/2005 | Ohsaki ............... 355/30 |
| 2005/0146694 A1 | 7/2005 | Tokita ............... 355/30 |
| 2005/0151942 A1 | 7/2005 | Kawashima ............... 355/30 |
| 2005/0200815 A1 | 9/2005 | Akamatsu ............... 353/53 |
| 2005/0213065 A1 | 9/2005 | Kitaoka ............... 355/53 |
| 2005/0213066 A1 | 9/2005 | Sumiyoshi ............... 355/53 |
| 2005/0219489 A1 | 10/2005 | Nei et al. ............... 355/53 |
| 2005/0233081 A1 | 10/2005 | Tokita ............... 427/256 |
| 2005/0259232 A1* | 11/2005 | Streefkerk et al. ............ 355/53 |
| 2006/0119813 A1 | 6/2006 | Hultermans et al. .......... 355/53 |

FOREIGN PATENT DOCUMENTS

| | | |
|---|---|---|
| DE | 221 563 | 4/1985 |
| DE | 224 448 | 7/1985 |
| DE | 242 880 | 2/1987 |
| EP | 0023231 | 2/1981 |
| EP | 0418427 | 3/1991 |
| EP | 1039511 | 9/2000 |
| EP | 1 420 298 A2 | 5/2004 |
| EP | 1 420 300 A2 | 5/2004 |
| EP | 1 530 088 | 5/2005 |
| EP | 1 610 183 A2 | 12/2005 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| WO | WO 99/49504 | 9/1999 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/090577 | 10/2004 |
| WO | WO 2004/090633 | 10/2004 |
| WO | WO 2004/090634 | 10/2004 |
| WO | WO 2004/092830 | 10/2004 |
| WO | WO 2004/092833 | 10/2004 |
| WO | WO 2004/093130 | 10/2004 |
| WO | WO 2004/093159 | 10/2004 |
| WO | WO 2004/093160 | 10/2004 |
| WO | WO 2004/095135 | 11/2004 |
| WO | WO 2004/105107 | 12/2004 |
| WO | WO 2005/010611 | 2/2005 |
| WO | WO 2005/024517 | 3/2005 |
| WO | WO 2006/080516 A1 | 8/2006 |
| WO | WO 2006/093340 A1 | 9/2006 |

OTHER PUBLICATIONS

European Search Report issued for European Patent Application No. 06253179.3 - 2222, dated Mar. 21, 2007.

M. Switkes et al., "Immersion Lithography at 157 nm", MIT Lincoln Lab, Orlando 2001-1, Dec. 17, 2001.

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths To Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations — Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future Fab International, vol. 15, Jul. 11, 2003.

H. Kawata et al., "Fabrication of 0.2μm Fine Patterns Using Optical Projection Lithography with an Oil Immersion Lens", Jpn. J. Appl. Phys. vol. 31 (1992), pp. 4174-4177.

G. Owen et al., "1/8μm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International Sematech, Los Angeles, Jan. 27-29, 2004, Slide Nos. 1-51.

H. Hata, "The Development of Immersion Exposure Tools", Litho Forum, International Sematech, Los Angeles, Jan. 27-29, 2004 Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004

B. Lin, The $k_3$ coefficient in nonparaxial NNA scaling equations for resolution, depth of focus, and immersion lithography, *J. Microlith., Microfab., Microsyst.* 1(1):7-12 (2002).

Chinese Office Action for Chinese Application No. 200610100125.7 dated May 15, 2009.

Notification of Reasons for Refusal for Japanese Patent Application No. 2006-176038 dated Jul. 7, 2009.

* cited by examiner

LITHOGRAPHIC APPARATUS AND DEVICE MANUFACTURING METHOD

1. FIELD

The present invention relates to a lithographic apparatus and a method for manufacturing a device.

2. BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

There are many circumstances in immersion lithography in which one or more surfaces are covered in immersion liquid. Many of these surfaces must then be cleared of immersion liquid further down the manufacturing process.

3. SUMMARY

Accordingly, it is desirable to provide an immersion apparatus with an effective means to remove immersion liquid from a surface.

According to an aspect of the invention, there is provided a lithographic projection apparatus arranged to project a pattern from a patterning device onto a substrate through a liquid, the apparatus comprising a gas knife configured to provide gas onto a surface, an extractor adjacent the gas knife to remove gas, liquid, or both, and a flow regulator configured to control a gas flow rate out of the gas knife to be within 20% of a gas flow rate into the extractor.

According to an aspect of the invention, there is provided a lithographic projection apparatus arranged to project a pattern from a patterning device onto a substrate through a liquid, the apparatus comprising a gas knife configured to provide gas to a surface, wherein the gas knife comprises an outlet to exit gas, the outlet having a width of between 10 and 50 µm and a length of between 100 and 500 µm.

According to an aspect of the invention, there is provided a lithographic projection apparatus arranged to project a pattern from a patterning device onto a substrate through a liquid, the apparatus comprising a gas knife configured to provide gas to a surface to be dried at an angle to the surface of between 70° and 85°.

According to an aspect of the invention, there is provided a lithographic projection apparatus arranged to project a pattern from a patterning device onto a substrate through a liquid, the apparatus comprising a gas knife configured to provide gas to a surface to be dried, a first extractor, and a second extractor, the first and second extractors being on opposite sides of the gas knife and configured to remove gas, liquid, or both, from the surface.

According to an aspect of the invention, there is provided a lithographic projection apparatus arranged to project a pattern from a patterning device onto a substrate through a liquid, the apparatus comprising a gas knife configured to remove a liquid from a surface, the gas knife arranged such that passage of the liquid is blocked by a formation of a pressure gradient in the liquid.

According to an aspect of the invention, there is provided a device manufacturing method comprising projecting through an immersion liquid a patterned beam of radiation onto a substrate, wherein immersion liquid is removed from a surface by a flow of gas from a gas knife to an extractor positioned adjacent the gas knife, the gas flow rate out of the gas knife being within 20% of the gas flow rate into the extractor.

According to an aspect of the invention, there is provided a device manufacturing method comprising projecting through a liquid a patterned beam of radiation onto a substrate, wherein liquid is removed from a surface by a flow of gas out of an outlet of a gas knife which outlet has a width of between 10 and 50 µm and a length of between 100 and 500 µm.

According to an aspect of the invention, there is provided a device manufacturing method comprising projecting through a liquid a patterned beam of radiation onto a substrate, wherein liquid is removed from a surface by a flow of gas impinging on the surface at an angle of between 70° and 85°.

According to an aspect of the invention, there is provided a device manufacturing method comprising projecting through a liquid a patterned beam of radiation onto a substrate, wherein liquid is removed from a surface by formation of a pressure gradient in the liquid by gas.

According to an aspect of the invention, there is provided a device manufacturing method comprising projecting through a liquid a patterned beam of radiation onto a substrate, wherein passage of liquid is blocked by formation of a pressure gradient in the liquid by gas.

4. BRIEF DESCRIPTION OF THE DRAWINGS

Embodiments of the invention will now be described, by way of example only, with reference to the accompanying schematic drawings in which corresponding reference symbols indicate corresponding parts, and in which.

5. DETAILED DESCRIPTION

Figure 1:
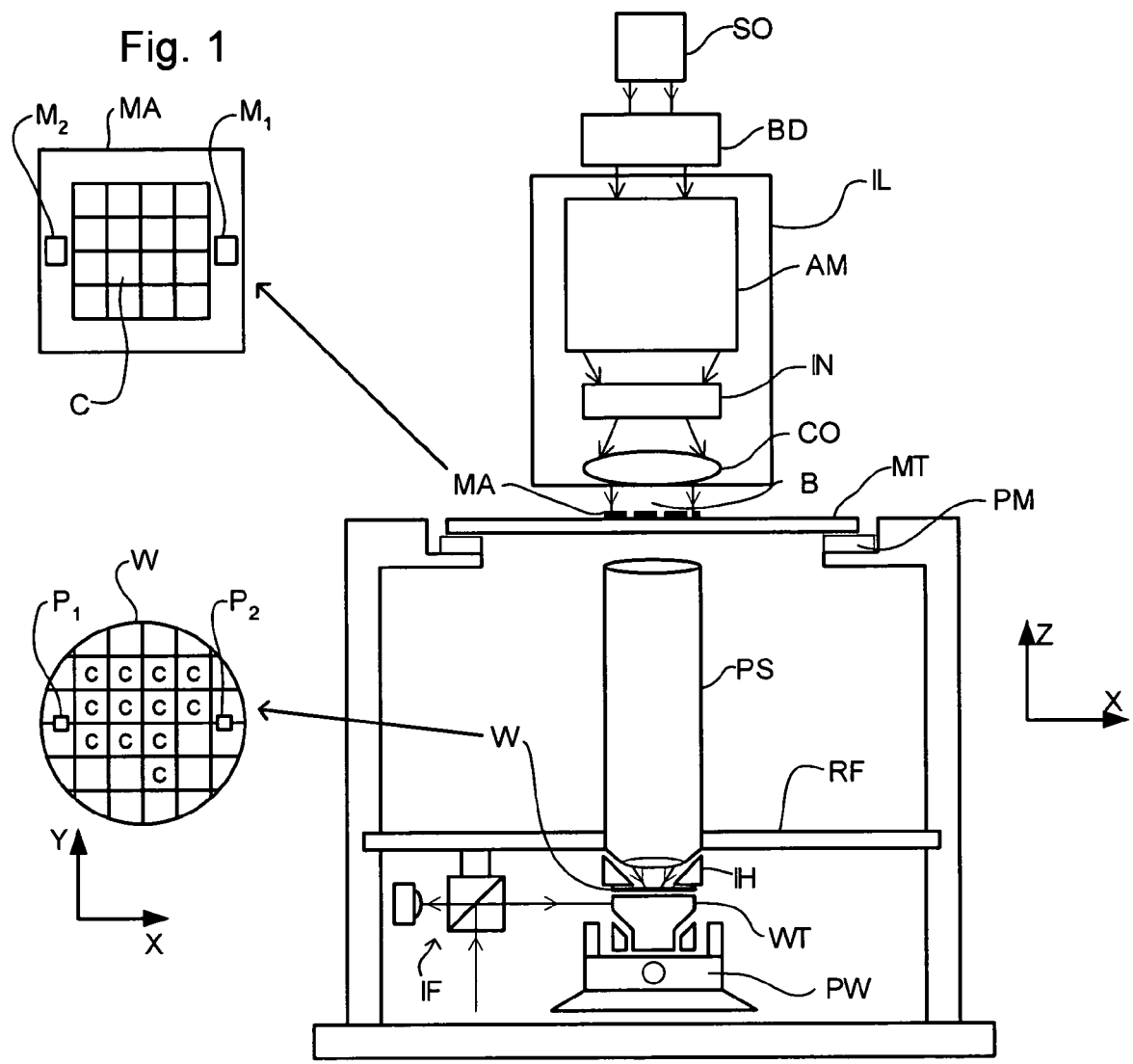
FIG. 1 depicts a lithographic apparatus according to an embodiment of the invention.
Figure 2:
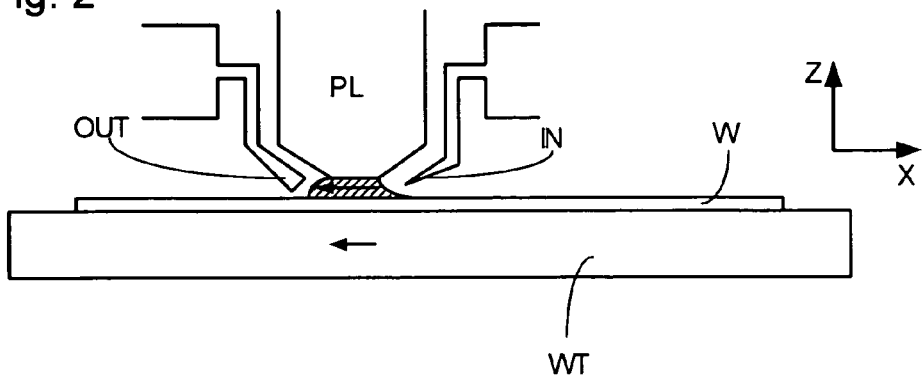
FIGS. 2 and 3 depict a liquid supply system for use in a lithographic projection apparatus.
Figure 3:
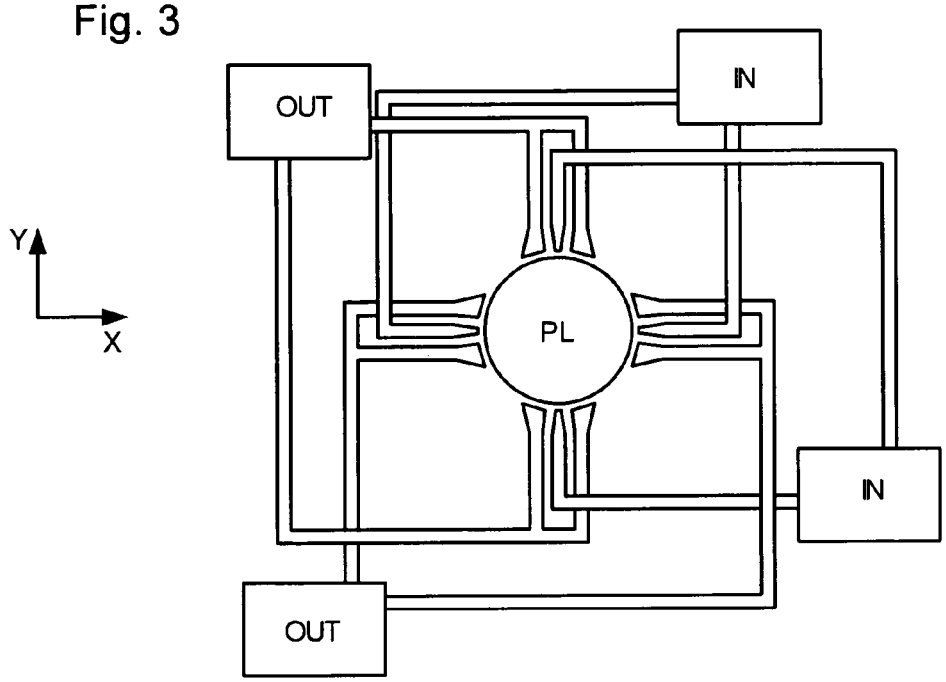

FIG. 1 schematically depicts a lithographic apparatus according to one embodiment of the invention. The apparatus comprises:

an illumination system (illuminator) IL configured to condition a radiation beam B (e.g. UV radiation or DUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively)

of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 4:
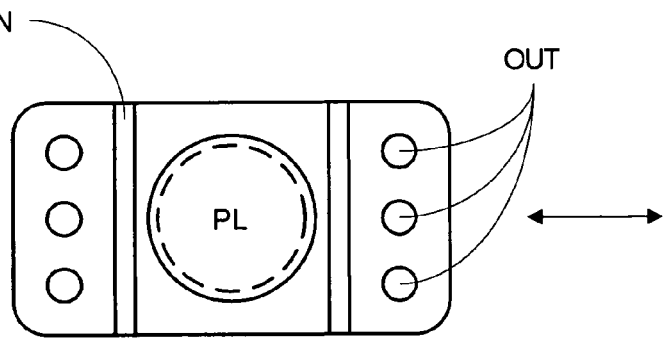
FIG. 4 depicts a further liquid supply system for use in a lithographic projection apparatus.
Figure 4:
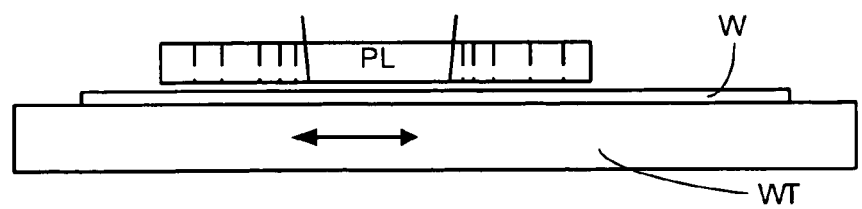

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Another solution which has been proposed is to provide the liquid supply system with a liquid confinement structure which extends along at least a part of a boundary of the space between the final element of the projection system and the substrate table. The liquid confinement structure is substantially stationary relative to the projection system in the XY plane though there may be some relative movement in the Z direction (in the direction of the optical axis). In an embodiment, a seal is formed between the liquid confinement structure and the surface of the substrate. The seal may be a contactless seal such as a gas seal. Such a system is disclosed in United States patent application publication US 2004-0207824 and European patent application publication EP-A-1,420,298, each hereby incorporated in its entirety by reference, and illustrated in FIG. 5.

Figure 5:
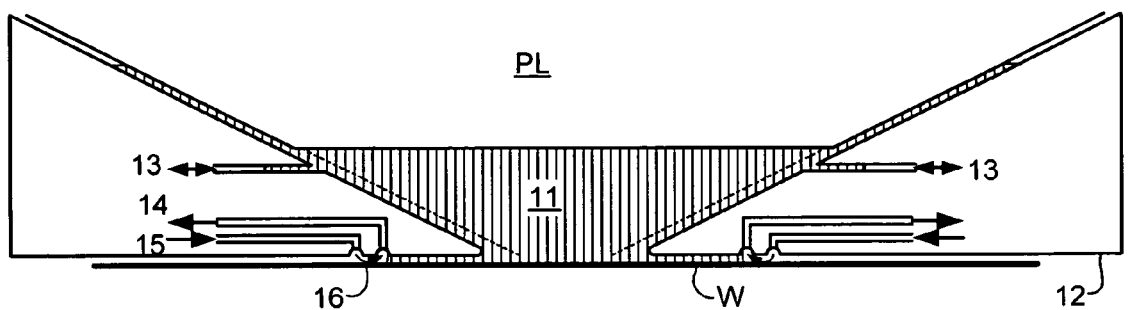
FIG. 5 depicts, in cross-section, another liquid supply system for use in a lithographic projection apparatus.

As shown in FIG. 5, a liquid supply system is used to supply liquid to the space between the projection system and the substrate. The reservoir 10 forms a contactless seal to the substrate around the image field of the projection system so that liquid is confined to fill a space between the substrate surface and a final element of the projection system. The reservoir is formed by a liquid confinement structure 12 positioned below and surrounding the final element of the projection system PL. Liquid is brought into the space below the projection system and within the liquid confinement structure 12. The liquid confinement structure 12 extends a little above the final element of the projection system and the liquid level rises above the final element so that a buffer of liquid is provided. The liquid confinement structure 12 has an inner periphery that at the upper end, in an embodiment, closely conforms to the shape of the projection system or the final element thereof and may, e.g., be round. At the bottom, the inner periphery closely conforms to the shape of the image field, e.g., rectangular though this need not be the case.

The liquid is confined in the reservoir by a gas seal 16 between the bottom of the liquid confinement structure 12 and the surface of the substrate W. The gas seal is formed by gas, e.g. air, synthetic air, $N_2$ or an inert gas, provided under pressure via inlet 15 to the gap between liquid confinement structure 12 and substrate and extracted via outlet 14. The overpressure on the gas inlet 15, vacuum level on the outlet 14 and geometry of the gap are arranged so that there is a high-velocity gas flow inwards that confines the liquid.

There are several instances in an immersion lithographic apparatus where drying of a surface previously covered in immersion liquid is needed. For example, after imaging of a substrate, it is advantageous to completely dry the substrate. A gas knife can be used to dry previously wet surfaces.

Several of the ways of containing immersion liquid in a lithographic projection apparatus between the projection system PL and the substrate W are related to the so-called localized area solution in which a surface of the substrate which is, in plan, smaller than the total surface of the substrate is wetted with immersion liquid. A liquid confinement system is used to contain the immersion liquid to only the localized area. A difficulty with an embodiment of such a localized solution is that during scanning of the substrate under the projection system a seal is formed between the liquid confinement system and the substrate W which is contactless. One way of ensuring that immersion liquid does not escape from the liquid confinement system and thereby contaminate other parts of the apparatus is to provide a gas knife around the periphery of the liquid confinement system to dry the surface of the substrate of any residual immersion liquid which has not been removed or contained by other components of the liquid confinement system. Indeed, a gas knife may be formed as part of a liquid confinement system, such as in a liquid confinement structure which surrounds the space containing the immersion liquid and forms a seal to the substrate.

Figure 6:
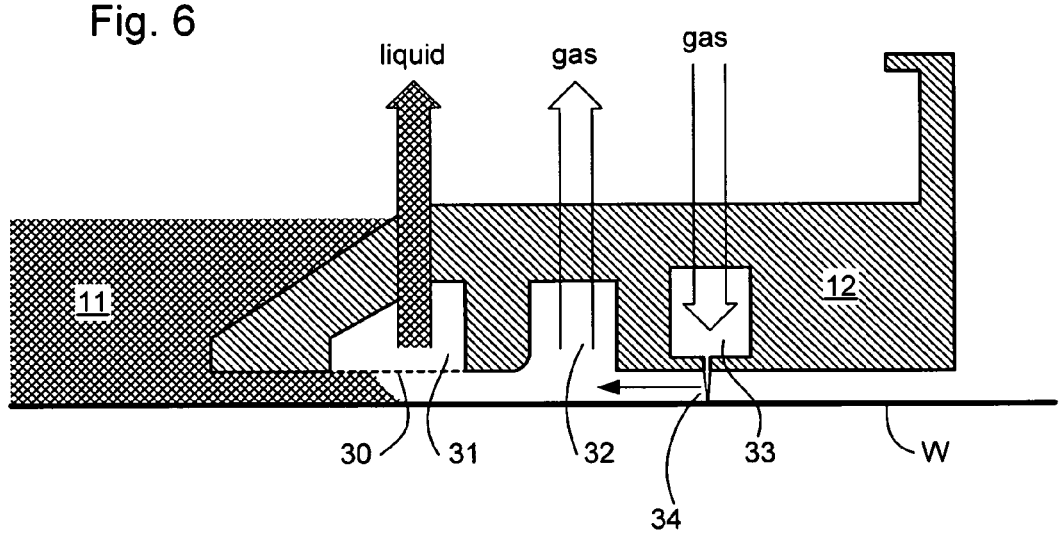
FIGS. 6 and 7 illustrate half of a liquid supply system, in cross-section, in which a gas knife is used.

In a liquid confinement structure 12 illustrated in FIG. 6, an extractor 31 extracts liquid from the localized area to the left hand side of the Figure through gauze 30. The extractor 31 may extract both liquid and gas or only liquid. A recess 32 is provided radially outwardly of the extractor 31 and a gas knife 33 is provided radially outwardly of the recess 32. The gas knife forms a jet of gas 34 which is used to dry the surface of the substrate W. In a similar embodiment illustrated in FIG. 7, a modification of the recess 32 is made such that a passage 40 exists which is open to a gas source, for example the atmosphere, such that a flow of gas from the passage 40 radially outwardly to a passage 50 which is connected to a low pressure source is created. The gas knives disclosed can be used for general drying applications and in particular for gas knives which may form part of a liquid confinement structure 12.

A gas knife typically works on the principle of inducing a shear force on any residual liquid on a surface through a gas flow moving over the surface of the residual liquid. This requires an extremely high flow of gas out of the gas knife and also requires a narrow gap between the substrate W and the outlet of the gas knife (i.e. in the case of a liquid confinement structure 12, between the bottom surface of the liquid confinement structure 12 and the top surface of the substrate W).

By adjusting the configuration of the gas knife, a zone of increased pressure can be created and a liquid can be prevented from passing that zone. The zone is created by having a "curtain" of gas aimed at the surface. This forms a high pressure liquid barrier and a pressure gradient can be formed in the liquid and it is the formation of this pressure gradient rather than the presence of a drag force at the liquid surface which is effective to dry the surface by keeping the liquid to one side of the gas knife during movement of the substrate W or other surface underneath the gas knife i.e. the pressure gradient is the dominant force. A pressure gradient can be formed at gas speeds of between 50 m/s and 200 m/s. A controller is provided to regulate the gas flows and the height of the gas knife. A shear force mechanism can be arranged to remove the liquid.

By removing liquid by the formation of a pressure gradient, relatively little gas may be used compared to when the surface is dried by shear forces and a relatively large distance between the outlet of the gas knife and the surface being dried may be possible.

The gas knife will be described below in relation to drying of a substrate W, in particular to the use of the gas knife in a liquid confinement structure. However, the gas knife can be used for any other application of drying a surface, perhaps for drying the top surface of the substrate table WT which may also have immersion liquid on it from time to time or any other component or indeed may be used for drying a substrate or another component at a position in the immersion lithographic apparatus perhaps other than under the projection system PL.

Figure 8:
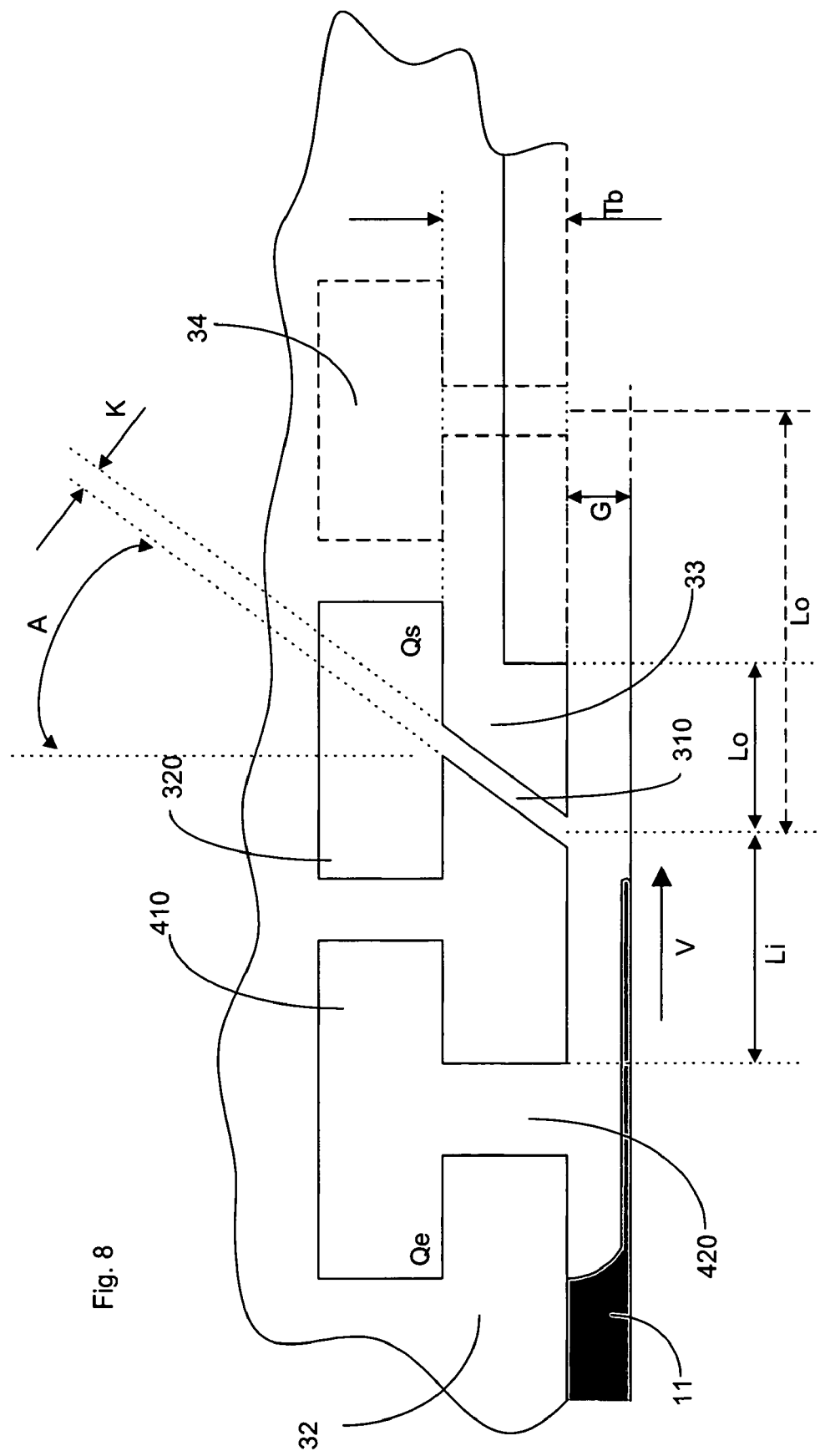
FIG. 8 illustrates, in schematic cross-section, a gas knife according to an embodiment of the present invention.

FIG. 8 illustrates schematically a gas knife generally labeled 33 and a recess or extractor generally labeled 32. The gas knife comprises an outlet 310 in the form of a nozzle. Several variables are illustrated in FIG. 8. These are the width K of the nozzle outlet 310 of the gas knife (clearly the gas knife nozzle 310 is formed as a slit which has a length and a width, the slit extending into and out of the page in FIG. 8). An angle A of the nozzle of the gas knife is illustrated which is the angle which the nozzle makes to a line perpendicular to the surface through which the nozzle exits and perpendicular to the surface W to be dried. When the angle A is zero the gas knife nozzle is pointing directly down. Tb is the nozzle length and G is the distance between the nozzle outlet and the surface W (in the embodiment where the gas knife is part of a liquid confinement structure, this is the so-called 'ride height' of the liquid confinement structure). A distance Li is the distance between the gas knife nozzle outlet 310 and the extractor 32, V is the velocity of the surface W relative to the gas knife 33, Qs is the gas flow through the gas knife 33, and Qe is the gas flow through the extractor 32.

As can be seen, the gas knife 33 comprises a chamber 320. Gas enters the chamber 320 and the size of the chamber relative to the outlet dampens any possible pressure fluctuations before the gas exits through nozzle 310. A number of discrete inlets can be provided into the chamber 320 for the introduction of gas into the chamber 320.

The extractor 32 has a chamber 410 similar to that of chamber 320 of the gas knife 33. The extractor 32 also has an inlet 420 which provides a passage between the bottom surface of the gas knife and the chamber 410. However the narrow passage with inlet 420 can be omitted so that there is no narrowing between the chamber 410 and the inlet 420 in the bottom surface; the gap G can provide enough resistance for flow equalization.

The forces which act on liquid on the surface W are drag forces which occur due to a shear force at the gas/liquid interface, pressure forces which are forces due to local pressure gradient, virtual mass or inertia forces which are forces needed to accelerate a given volume of liquid, and general body forces. The last two components are related to movement of the surface whereas the first two components are determined by the gas knife design.

During optimization of the gas knife, the influence of evaporation of liquid (e.g., water) should be accounted for. Evaporation depends on a number of factors including temperature, humidity of gas, and gas velocity (which depends on nozzle design). All may play an important role. Liquid evaporation is an undesirable phenomenon because it can lead to the cooling of the surface. Such cooling may deleteriously influence other things, most notably the substrate W surface shape, the temperature of components in the apparatus, and/or the temperature of the immersion liquid (thereby changing the index of refraction of the immersion liquid). Evaporation may be reduced or minimized by supplying gas with a relative high humidity to the gas knife 33. The pressure drop over the length of the outlet or nozzle 310 of the gas knife 33 should also be controlled to avoid cooling. In an embodiment using water and air, the pressure drop should not be greater than 0.2 bar otherwise the gas humidity will be decreased too much. Thus, the gas knife performance should be optimized for liquid removal as well as reducing or minimizing the pressure drop in the nozzle 310.

A local pressure build-up between the surface to be dried, the gas knife and the extractor of 0.05 bar gauge pressure or higher is sufficient for a flow regime of liquid being removed to be driven by a pressure gradient in the liquid rather than by shear forces. A local pressure build-up of 0.1 or even 0.2 bar gauge may be provided. If this can be achieved, in an embodiment using water, a residual liquid layer thickness of much less than 1 µm is possible (simulations and/or practical tests have shown a residual water layer thickness of between 200 and 400 nm is possible). There may be a negative relative pressure under the exhaust area which exerts an attractive force on the surface W towards the gas knife 33. This will need to be compensated for in the control dynamics of the apparatus if problems with imaging focus or of crashes is to be avoided and in any case the negative relative pressure should be reduced or minimized.

The table below shows the effect of various parameters of the gas knife on the relative pressure under the extractor ($dP_e$) and on the pressure drop over the nozzle length ($dP_n$).

| $Q_s/Q_e$ (l/min) | $T_b$ (µm) | K (µm) | G (µm) | $dP_e$ (Pa) | $dP_n$ (bar) |
|---|---|---|---|---|---|
| 100/110 | 500 | 35 | 200 | ~−1300 | 0.22 |
| 100/110* | 100 | 30 | 200 | ~−2000 | 0.15 |
| 60/67 | 500 | 10 | 200 | | 1 |
| 140/155 | 100 | 55 | 200 | | 0.05 |
| 90/100 | 500 | 35 | 150 | ~−1700 | 0.18 |
| 82/90* | 100 | 25 | 150 | ~−2000 | 0.16 |
| 75/83 | 100 | 20 | 150 | ~−2000 | 0.25 |

Escape of gas from the gas knife 33 out from under the assembly can be deleterious to the performance of interferometers because the interferometer beams may pass through gas that is badly conditioned. One way to substantially prevent this is to arrange for the exhaust flow Qe to be within about 20%, 10% or 5% of the gas knife flow Qs. The variables in the table marked with * are effective in this regard. A further advantage is that liquid can be collected from the other side of the gas knife 33 from the extractor 32 in this way. A disadvantage of this embodiment is that a deep under pressure is needed for this so that forces exerted on the substrate W and substrate table WT are high and may lead to deformations of the substrate W and any sensor on the substrate table WT.

A further exhaust 34 may be provided on the other side of the gas knife 33 to the extractor 32. This is illustrated in dashed lines in FIG. 8. The design of the further exhaust 34 may be the same as that of the extractor 32. This may reduce the relative under pressure in the exhaust region and may therefore be desirable. The provision of two exhausts does not lead to loss of performance. In this embodiment the gas flow moves in two directions (radially inwardly and outwardly) from the gas knife. However, as it is the pressure gradient in the liquid and not the gas flow over the liquid which is applying the removing force to the liquid, the removal of liquid is substantially not deleteriously affected.

The smaller the gap size G the more efficient extraction may be. This is because as the gap size G increases, a larger flow of gas and a thinner nozzle is needed to achieve the required pressure build-up but this is at the expense of an increased pressure drop over the nozzle length. However, decreasing the nozzle length leads to a narrowing of the nozzle and can lead to too high a negative pressure under the extractor. In an embodiment, the width of the nozzle may be 10 to 50 µm or between 25 and 35 µm with a length Tb of between 100 and 500 µm. In order to have a well defined gas flow out of the nozzle, a ratio of nozzle length Tb to nozzle width K between 3 to 1 and 20 to 1 may be provided. If the gap G is too large, the gas flow may diverge and the speed of the gas flow may be too low. A gap size G of between 50 and 300 µm may be suitable. An advantage of a pressure gradient flow regime over a shear flow regime is that height (i.e. gap size G) sensitivity is less.

The surface W should be moved in direction V illustrated in FIG. 8 such that a point on the substrate passes first under the extractor 32 before passing under the gas knife 33.

Figure 7:
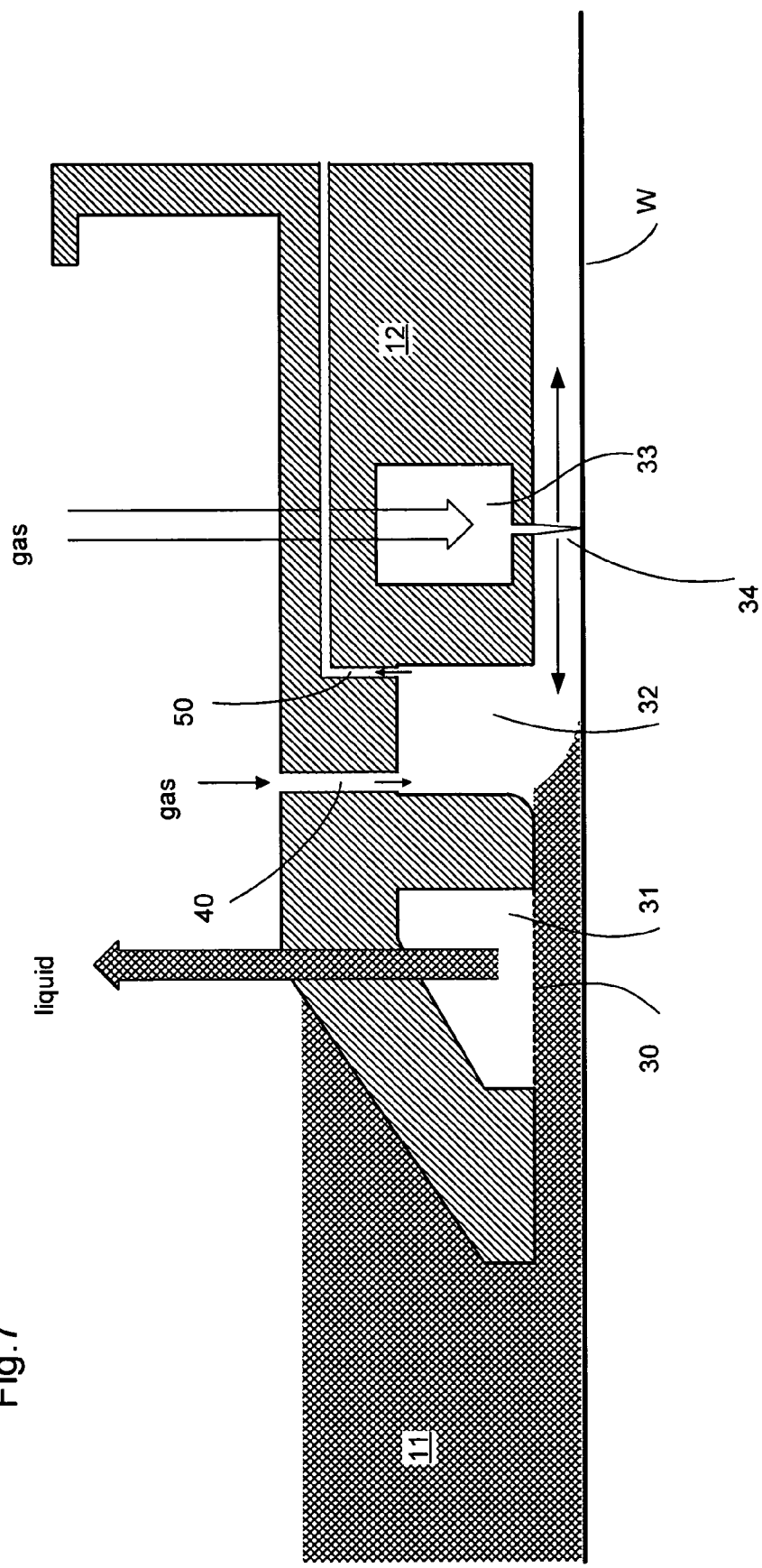

In order to reach a given gas speed (for example between 50 and 200 m/s) the flow rate out of the nozzle is proportional to the nozzle width K and the length of the gas knife (in the direction perpendicular to the plane of FIGS. 6 and 7). The flow rate out of the gas knife should typically be between 25 and 250 liters per minute. This means that the gas flow rate out of the gas knife should be between 75 and 750 liters per minute per meter length of the gas knife (with a nozzle width K of between 10 and 50 µm).

In an embodiment, the gas knife may be between 0.2 and 8 mm or 1 and 8 mm away from the extractor (distance Li). This range allows the establishment of a pressure zone to block the passage of liquid as well as shear action from gas passing over the surface of the liquid to move the liquid towards the extractor. If the distance Li is too short, the shear force can be hard to generate and the liquid is not moved towards the extractor.

In an embodiment, it is advantageous to angle the nozzle away from the vertical position in either direction (i.e. to arrange for the angle A to not be equal to zero). This helps in stabilizing the pressure zone which is formed by the gas knife 33. It is also possible to angle the gas exiting the nozzle 310 by balancing Qs and Qe accordingly and this achieves the same advantages. If Qs and Qe are equal, or very similar, the flow of gas out of nozzle 310 does not deviate much from vertical. In an embodiment, a range of angle A is 5 to 20°. This means that it is arranged for gas to be blown onto the surface W at an angle of between 70 and 85° to the surface. If the angle of the gas exiting the nozzle is controlled by varying Qe and Qs, Qe is between 0.4 to 0.45 Qs. The angle can also be varied by changing the length Li of the lands between the nozzle and the inlet to the extractor 32 and the length Lo between the nozzle and the inlet to the further extractor 34 or the end of the assembly. Arranging for Li to be between 0.5 and 0.8 Lo should achieve an exit angle of between 5 and 20° off vertical.

In European patent application publication EP 1420300 and United States patent application publication US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the invention may be applied to any immersion lithography apparatus, in particular, but not exclusively, those types mentioned above and whether the immersion liquid is provided in the form of a bath or only on a localized surface area of the substrate. A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A lithographic projection apparatus arranged to project a pattern from a patterning device onto a substrate through a liquid, the apparatus comprising a gas knife configured to provide a gas jet having a gas velocity of between about 50 m/s and 200 m/s to a surface to be dried, a first extractor, and a second extractor, the first and second extractors being on opposite sides of the gas knife and configured to remove gas, liquid, or both, from the surface.

2. The apparatus of claim 1, wherein a distance between the first extractor and the gas knife is 0.5 to 0.8 times the distance between the gas knife and the second extractor.

3. A lithographic projection apparatus arranged to project a pattern from a patterning device onto a substrate through a liquid, the apparatus comprising a gas knife configured to provide a gas jet to remove a liquid from a surface, the gas knife arranged such that passage of the liquid is blocked by a formation of a pressure gradient in the liquid and arranged to provide a gas flow out of the gas knife at a speed of between about 50 and 200 m/s.

4. The apparatus of claim 3, further comprising a flow controller configured to control flow rates of gas such that a local pressure between the surface, the gas knife and an extractor of at least 0.05 bar is built up.

5. The apparatus of claim 3, wherein the gas knife is part of a dryer of the apparatus to dry items after immersion in the liquid or part of a liquid confinement structure which at least partly surrounds a space in which the liquid is present.

6. The apparatus of claim 3, wherein liquid is removed by shear action of gas flowing over the liquid.

7. A lithographic projection apparatus arranged to project a pattern from a patterning device onto a substrate through a liquid, the apparatus comprising a gas knife configured to provide gas to a surface, wherein the gas knife comprises an outlet to exit gas, the outlet having a width of between 10 and 50 µm and a length of between 100 and 500 µm.

8. The apparatus of claim 7, wherein the gas knife comprises a chamber positioned up stream of the outlet.

9. The apparatus of claim 7, wherein the outlet is in the form of a slit.

10. The apparatus of claim 7, further comprising an extractor positioned adjacent the gas knife to remove gas, liquid, or both.

11. A lithographic projection apparatus arranged to project a pattern from a patterning device onto a substrate through a liquid, the apparatus comprising a gas knife configured to provide gas onto a surface, an extractor adjacent the gas knife to remove gas, liquid, or both, and a flow regulator configured to control a gas flow rate out of the gas knife to be within 20% of a gas flow rate into the extractor.

12. The apparatus of claim 11, further comprising a positioner configured to control a position of the surface, when being dried, such that a point on the surface passes the extractor before the gas knife.

13. The apparatus of claim 11, wherein the gas flow rate out of the gas knife is between 75 and 750 liters/minute/meter length of gas knife outlet.

14. The apparatus of claim 11, wherein an outlet of the gas knife is between 0.2 and 8 mm away from an inlet of the extractor.

15. A device manufacturing method comprising projecting through a liquid a patterned beam of radiation onto a substrate, wherein liquid is removed from a surface by a flow of gas out of an outlet of a gas knife which outlet has a width of between 10 and 50 µm and a length of between 100 and 500 µm.

16. The method of claim 15, wherein the gas knife comprises a chamber positioned upstream of the outlet.

17. The method of claim 15, wherein the outlet is in the form of a slit.

18. The method of claim 15, further comprising, adjacent the outlet, extracting gas, liquid, or both.

19. A device manufacturing method comprising projecting through a liquid a patterned beam of radiation onto a substrate, wherein liquid is removed from a surface by formation of a pressure gradient in the liquid by a flow of gas provided toward the surface at a speed of between about 50 and 200 m/s.

20. The method of claim 19, further comprising controlling flow rates of gas such that a local pressure between the surface, an outlet of a flow of gas toward the surface, and an inlet of gas, liquid, or both, from the surface of at least 0.05 bar is built up.

21. The method of claim 19, wherein the liquid is removed in a dryer of a lithographic apparatus to dry items after immersion in the liquid or by part of a liquid confinement structure which at least partly surrounds a space in which the liquid is present.

22. The method of claim 19, wherein liquid is removed by shear action of gas flowing over the liquid.

* * * * *